United States Patent
Piro et al.

(10) Patent No.: US 6,871,059 B1
(45) Date of Patent: Mar. 22, 2005

(54) PASSIVE BALUN FET MIXER

(75) Inventors: Philip Piro, Merrimack, NH (US); Kevin Cornman, Lyndeborough, NH (US)

(73) Assignee: Skyworks Solutions, Inc., Irvine, CA (US)

( * ) Notice: Subject to any disclaimer, the term of this patent is extended or adjusted under 35 U.S.C. 154(b) by 638 days.

(21) Appl. No.: 09/592,813

(22) Filed: Jun. 13, 2000

Related U.S. Application Data (60) Provisional application No. 60/139,679, filed on Jun. 16, 1999.

(51) Int. Cl.[7] .............................. H04B 1/28; H03H 7/01
(52) U.S. Cl. ...................... 455/333; 455/326; 455/319; 455/292; 455/311; 333/119; 333/177; 327/118
(58) Field of Search ................................ 455/311, 333, 455/326, 323, 306, 334, 338, 330, 313, 318, 280, 292, 327; 333/24 R, 119, 177; 327/113, 119, 355, 356, 118, 114–117, 120–123

(56) References Cited

U.S. PATENT DOCUMENTS

| | | | | |
|---|---|---|---|---|
| 4,705,967 A | | 11/1987 | Vasile | 324/581 |
| 5,027,163 A | | 6/1991 | Dobrovolny | 455/326 |
| 5,060,298 A | * | 10/1991 | Waugh et al. | 455/326 |
| 5,280,648 A | * | 1/1994 | Dobrovolny | 455/326 |
| 5,697,092 A | * | 12/1997 | Mourant et al. | 455/323 |
| 5,732,345 A | | 3/1998 | Vice | 455/333 |
| 5,752,181 A | * | 5/1998 | Vice | 455/326 |
| 5,799,248 A | * | 8/1998 | Vice | 455/333 |
| 6,026,286 A | * | 2/2000 | Long | 455/327 |
| 6,057,714 A | * | 5/2000 | Andrys et al. | 327/105 |
| 6,064,872 A | * | 5/2000 | Vice | 455/326 |
| 6,144,236 A | * | 11/2000 | Vice et al. | 327/113 |
| 6,278,872 B1 | * | 8/2001 | Poulin et al. | 455/333 |

OTHER PUBLICATIONS

Vasile, C. F. "Floating GASFET Circuits Offering Unique Signal Processing from DC–EHF" GOMAC Proceedings, 305–309 1985.

Mourant, J–M. "A Low Cost Mixer For Wireless Applications" IEEE Microwave Systems Conference, 21–24 1995.

* cited by examiner

Primary Examiner—Rafael Perez-Gutierrez
(74) Attorney, Agent, or Firm—Bromberg & Sunstein LLP

(57) ABSTRACT

A FET mixer uses a balun having a primary and secondary, with the primary coupled to an radio frequency signal input. The mixer also includes a pair of field effect transistors (FETs), wherein the gates are coupled to one another and to a local oscillator input. One of the source and the drain of the second of the two transistors is coupled at a node to one of the source and the drain of the other of the two transistors, and the node is coupled to ground. The other of the source and the drain of the first of the two transistors is coupled to one side of the secondary of the balun and the other of the source and the drain of the second of the two transistors is coupled to the other side of the secondary of the balun. An intermediate frequency signal output is coupled to a point in the circuit path between the first and second transistors.

18 Claims, 6 Drawing Sheets

Prior Art

PASSIVE BALUN FET MIXER

PRIORITY

This application claims priority from U.S. provisional application Ser. No. 60/139,679 filed Jun. 16, 1999, entitled "Passive Balun FET Mixer" which is incorporated herein, by reference.

TECHNICAL FIELD

The present invention relates to mixer circuits, of the type having inputs for local oscillator (LO) and radio frequency (RF) signals and an intermediate frequency (IF) output, and in particular to mixer circuits using field effect transistors (FETs).

BACKGROUND ART

Mixers are contained in many radio transmitters, receivers, and other communication devices. Such mixers operate by combining an RF signal with LO, a periodic signal, producing a mixed output. This mixed output contains signals whose frequencies consist of either the sum or difference between RF and LO frequencies. By filtering the mixed output, an IF signal can be created whose frequency is either higher or lower than the original RF frequency.

As a result of the desire to decrease the size of communication devices, mixer size must also be reduced. Double balanced diode mixers, widely used in the industry, are large. By utilizing FETs instead of diodes, and removing the multiple baluns, size can be reduced without sacrificing performance.

Figure 1:
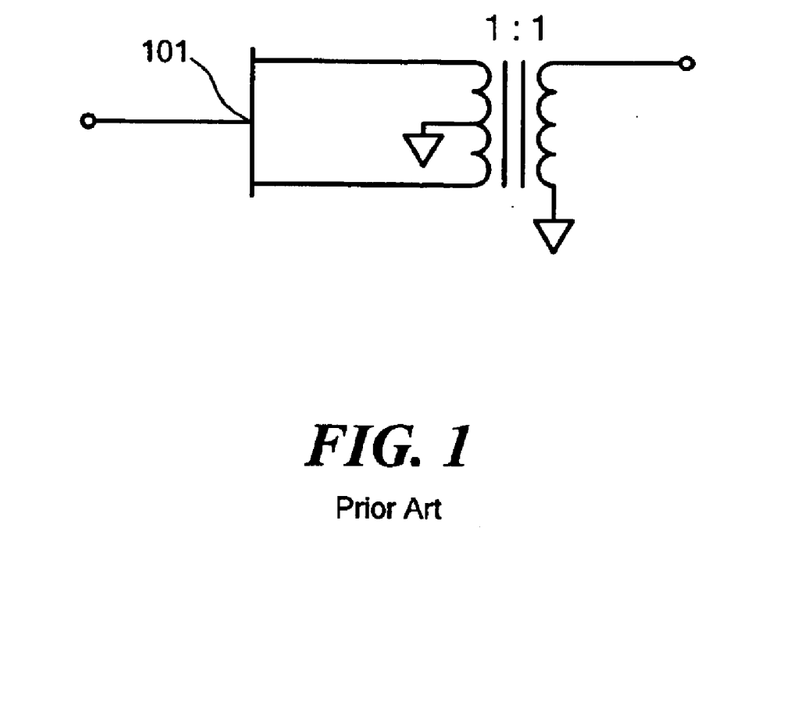
FIG. 1 shows a prior art single floating FET configuration, as shown in U.S. Pat. No. 4,705,967.
Figure 2:
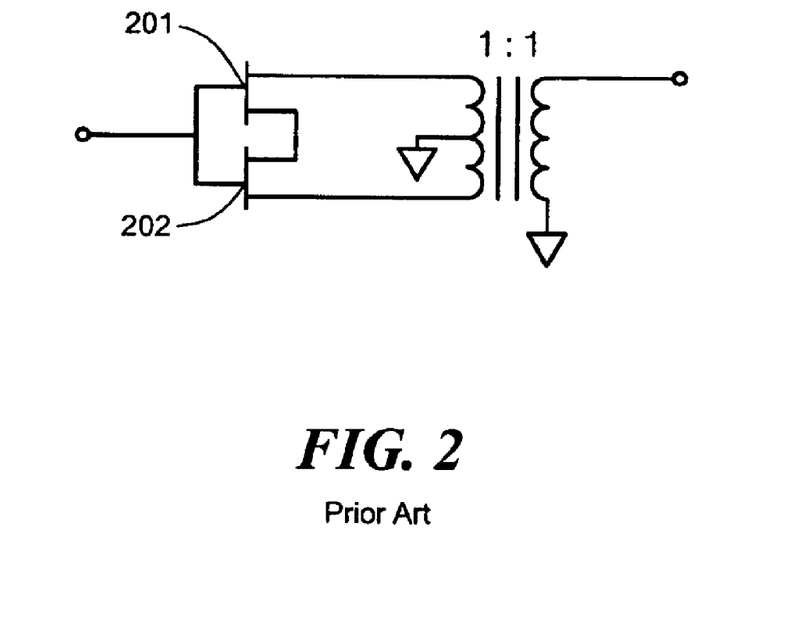
FIG. 2 shows a prior art series connected floating FET configuration, as shown in U.S. Pat. No. 4,705,967.
Figure 3:
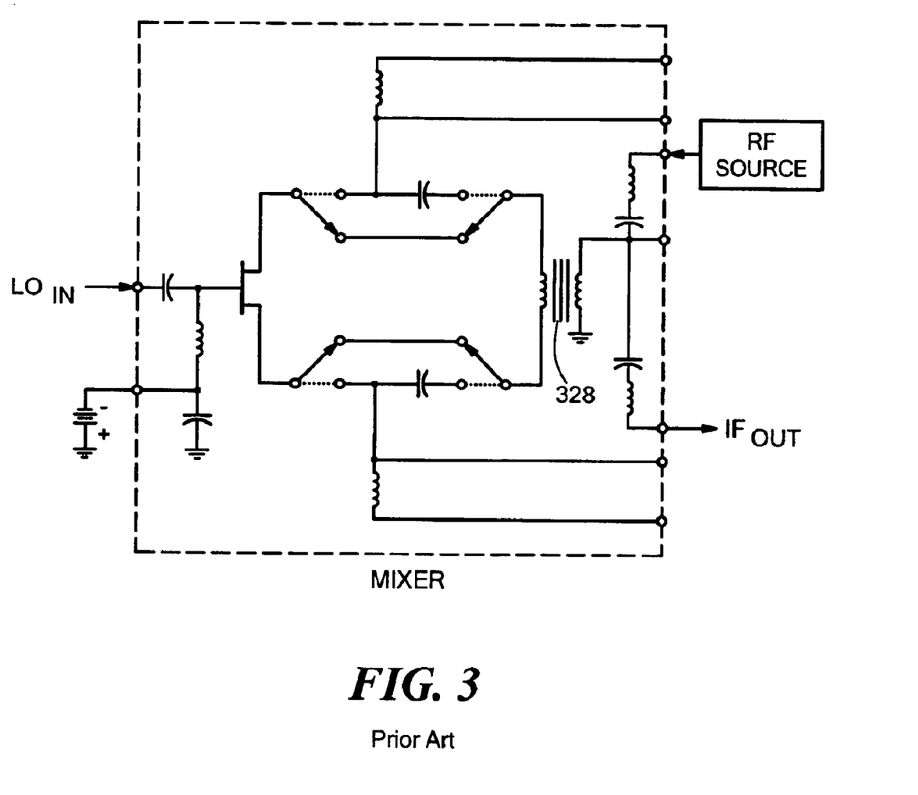
FIG. 3 is a schematic view of a prior art single FET mixer, as shown in U.S. Pat. No. 4,705,967.

Passive floating FET mixers are known in the art. A floating FET configuration uses an electrically symmetrical FET, whose drain and source terminals float with respect to ground and are coupled to the output port via a balun, as described in Vasile, C. F., Floating GASFET Circuits Offering Unique Signal Processing from DC-EHF, 1985 GOMAC Proceedings, Pp.305–309, 1985, incorporated herein by reference in it's entirety. FIG. 1, taken from Vasile's article, shows a single floating FET 101 configuration. An alternative floating FET configuration which replaces the single transistor with two transistors 201 and 202 in series is shown in FIG. 2, also taken from Vasile's article. U.S. Pat. No. 4,705,967, issued for an invention of Vasile and incorporated herein by reference in it's entirety, discloses a floating multifunction FET circuit that may be used as a mixer, as shown in FIG. 3. The IF is extracted from the same side of the balun 328 as the RF signal. Therefore, the balun 328 in this design must be large to account for both the higher frequency RF signal and the lower frequency IF signal. Additionally, the RF and IF signals are not isolated, resulting in possible distortion of these signals.

Figure 4:
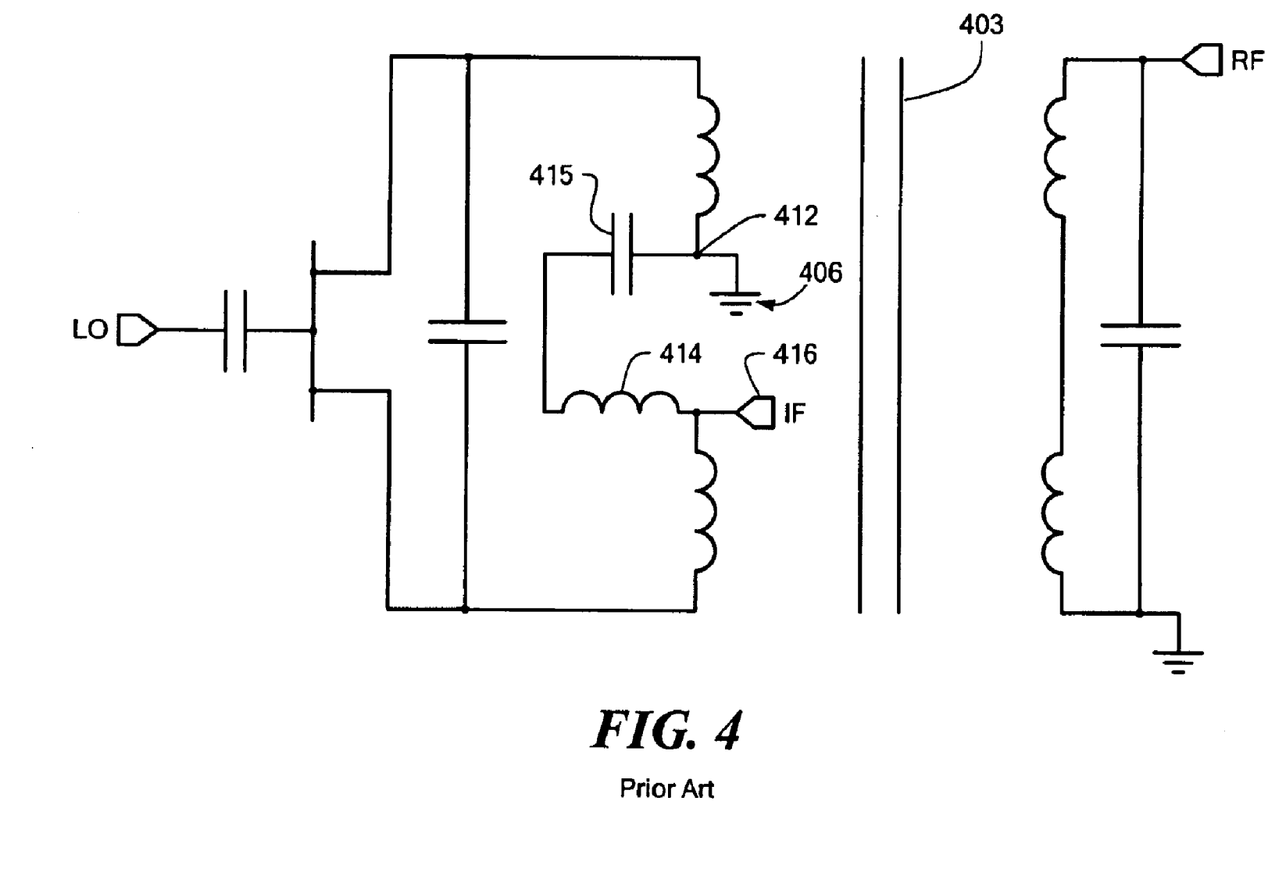
FIG. 4 is a schematic view of a prior art single FET mixer, as shown in U.S. Pat. No. 5,697,092.

Mourant, in U.S. Pat. No. 5,697,092 and in "A Low cost Mixer for Wireless Applications," 1995 IEEE Microwave Systems Conference pp. 21–24, also discloses similar subject matter pertaining to passive floating FET mixers, each of which is hereby incorporated herein by reference in its entirety. In U.S. Pat. No. 5,697,092, a single, floating FET mixer suitable for compact construction is disclosed, as shown in FIG. 4, taken from Mourant. The balanced IF created in the FET mixer is extracted at the RF balun 403 in an unbalanced manner, being diplexed from the balun center tap. A series inductor 414 and capacitor 415 resonates at the RF frequency and shorts out center tap 412 to ground 406. At low frequencies, the capacitor 415 is an open, allowing the IF 416 to be extracted. The balun 403 is fabricated with primary and secondary windings consisting of planar metal spirals that are interleaved with one another, as described by Mourant, col. 4, lines 11–18. One problem with this design is that adding a centertap to a balun adds steps to the manufacturing process. Additionally, the centertap position must be located, requiring calculation and testing. Another problem is that the IF output leads must cross over portions of the interleaved windings, making it susceptible to parasitic capacitance.

SUMMARY OF THE INVENTION

In accordance with one aspect of the invention, a FET mixer uses a balun having a primary and secondary, with the primary coupled to an RF signal input. The mixer also includes a pair of field effect transistors (FETs), wherein the gates are coupled to one another and to a local oscillator input. One of the source and the drain of the second of the two transistors is coupled at a node to one of the source and the drain of the other of the two transistors, and the node is coupled to ground. The other of the source and the drain of the first of the two transistors is coupled to one side of the secondary of the balun and the other of the source and the drain of the second of the two transistors is coupled to the other side of the secondary of the balun. An intermediate frequency signal output is coupled to a point in the circuit path between the first and second transistors.

In a further related embodiment, at the node, one of the source and the drain of the second of the two transistors is connected to ground, and the node is coupled to one of the source and drain of the first of the two transistors by means of a filter. In a related embodiment, the filter has a capacitor serving as a shunt at the frequency of the RF signal but not at the frequency of the intermediate frequency signal.

In another related embodiment, the local oscillator input is coupled to the gates via a capacitor so as to cause the transistors to be biased near pinch off, and a capacitance is disposed across the balun secondary to tune the secondary. The capacitance may optionally be realized by a pair of capacitors connected in series, wherein the node at a connection between the capacitors is coupled to ground. Also optionally, the secondary has a center tap, and the center tap is coupled to ground.

In accordance with another aspect of the invention, a method of mixing a periodic signal and a radio frequency signal producing an intermediate frequency signal is provided. A radio frequency signal is applied to a primary of a balun. Simultaneously, a periodic signal is applied to a first and a second switch, each switch coupled to the other switch and also coupled to a secondary of the balun, resulting in a frequency translation of the periodic signal and the radio frequency signal producing a mixed output. The intermediate frequency signal is outputted by filtering the mixed output between the first and second switch. In a further related embodiment, the filter includes coupling one switch at a node to ground, and coupling the other switch to the node by means of a filter. The filter may apply a capacitance that serves as a shunt at the frequency of the RF signal but not at the frequency of the intermediate signal. In another related embodiment, a capacitance is applied across the balun primary to tune the primary. A capacitance may optionally be applied across the balun secondary to tune the secondary, which may include a pair of capacitors in series, wherein the node at a connection between the capacitors is coupled to ground. In another related embodiment, ground is coupled to the center tap of the balun secondary.

In another embodiment, a FET mixer uses a transformer, having a primary and secondary, the primary coupled to an RF signal. The mixer also has a pair of switches, comprising of a first switch and a second switch, wherein the gates of the switches are coupled to one another and to a periodic signal input. The first switch is coupled at a node to ground, and the node is coupled to the second switch. Additionally, one switch is attached to one side of the secondary of the transformer, and the other switch is attached to the other side of the secondary of the transformer. An intermediate frequency signal output is coupled to a point in the circuit path between the first and second transistor. In a further related embodiment, at the node, one of the switches is connected to ground, and the node is coupled to the other switch by means of a filter. The filter may have a capacitor that serves as a shunt at the frequency of the RF signal but not at the frequency of the intermediate frequency signal. In another related embodiment, tuning circuitry is disposed across the transformer's secondary, and may include a pair of capacitors in series, wherein the node at a connection between the capacitors is coupled to ground. In another related embodiment, the secondary of the transformer has a center tap, which is coupled to ground. In another related embodiment, tuning circuitry is disposed across the primary of the transformer.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

For the purposes of the description herein and the claims that follow it, unless the context otherwise requires, the term "Radio Frequency" (RF) means an electromagnetic signal at frequencies in the range extending from below 3 kilohertz to 300 gigahertz, which includes radio and television transmission. These frequencies are above audio signals and below the frequencies of visible light. The term "intermediate frequency" (IF) shall mean the frequency that an incoming signal is changed to. The term "local oscillator" (LO) shall mean a periodic signal. The term "balun" shall mean a transformer connected between a balanced source or load and an unbalanced source or load. A balanced line has two conductors, with equal currents in opposite directions. The unbalanced line has just one conductor; the current in it returns via a common ground or earth path.

Figure 5:
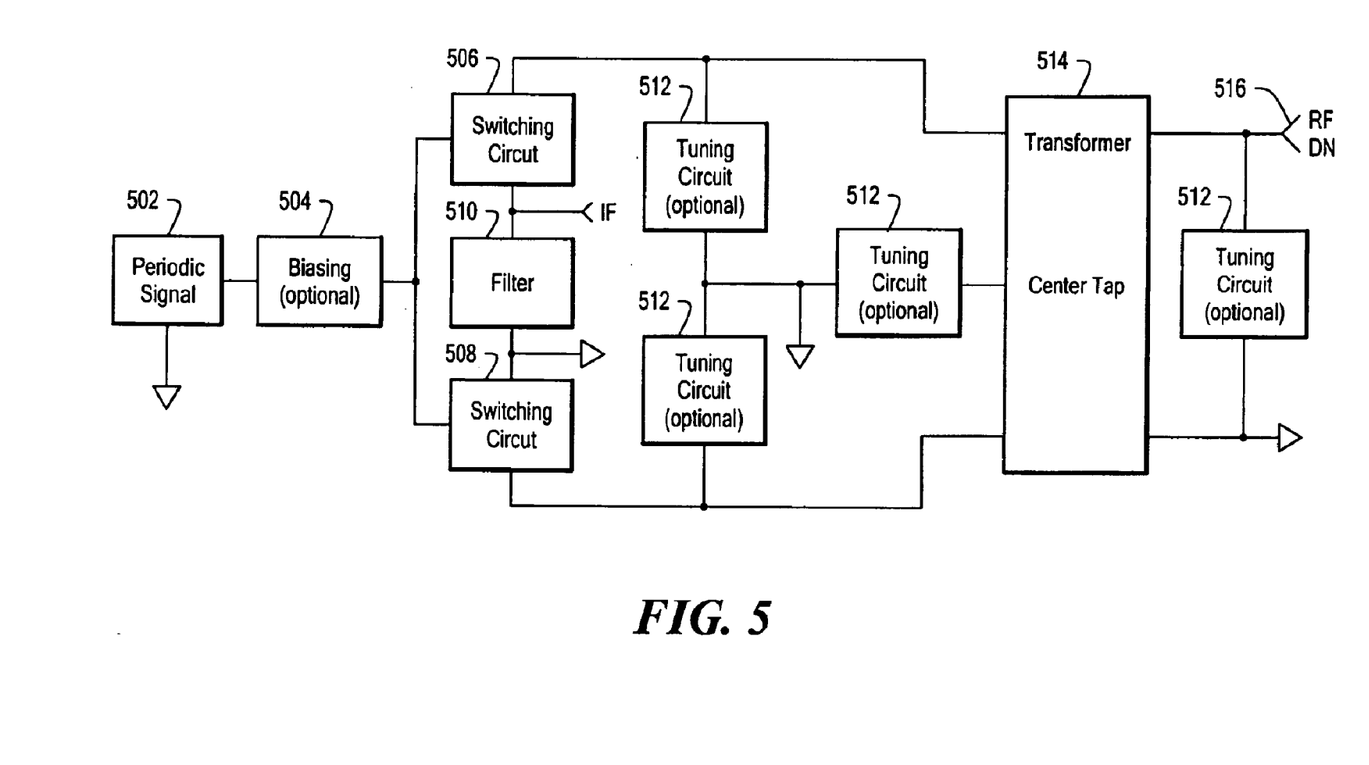
FIG. 5 is a block diagram of a passive balun FET mixer in accordance with an embodiment of the present invention.

FIG. 5 is a block diagram of the passive balun FET mixer in accordance with an embodiment of the present invention. Two switches 506, 508 are turned on and off by a periodic signal 502. An RF signal 516 is applied to the primary of a transformer 514, which is coupled to the balanced side of the balun across the switches. A frequency translation of the periodic signal and the RF signal is thus produced. The IF signal is retrieved by applying a filter 510 to the mixed output between the first and second switch, as opposed to extracting the IF signal from the centertap of the transformer. By not utilizing the centertap of the balun to extract the IF, several benefits are achieved. The manufacturing process is simplified, the centertap position does not have to be found and tested, and a potential source of parasitic capacitance is removed. Optional tuning circuitry 512 for the primary and secondary of the transformer may be, added, along with biasing circuitry 504.

Figure 6:
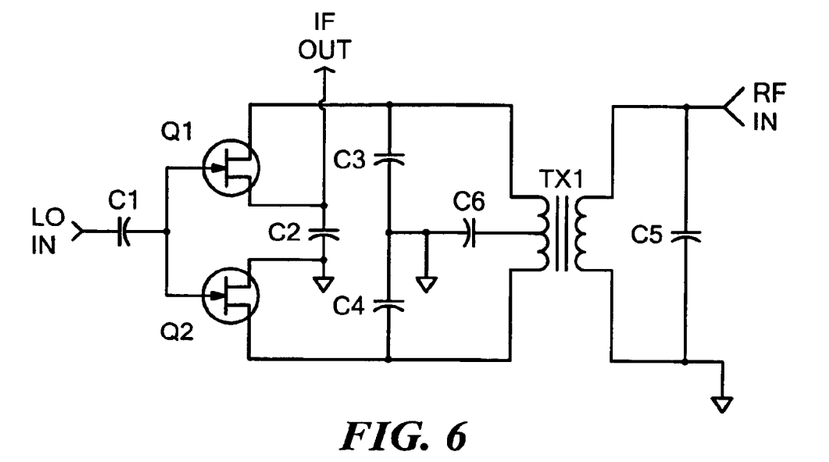
FIG. 6 is a schematic view of a passive balun FET mixer in accordance with an embodiment of the present invention.

FIG. 6 shows a passive balun FET mixer in accordance with another embodiment of the present invention. The mixer includes two FET transistors, Q1 and Q2. The drains of Q1 and Q2 are connected to the secondary winding of a transformer TX1 acting as a balun. A coupling capacitor C1 couples a local oscillator (LO) input to the gates of Q1 and Q2. The mixer also includes an IF bypass capacitor C2, and three tuning capacitors C3, C4, and C5.

The gates of the two FETs are connected together and coupled to the LO signal by a capacitor C1. The use of two FETs allows each transistor to handle less voltage, creating less distortion in FET output. Additionally, the parasitic capacitances formed across the gates of each transistor to LO will cancel as a result of using two FETs.

The primary winding of the transformer TX1 is coupled between the RF input port and ground. One side of the secondary winding of the transformer TX1 is connected to the drain of FET transistor Q1, and the other side of the secondary winding of transformer TX1 is connected to the drain of Q2. The source of transistor Q2 is connected to ground, while the source terminal of transistor Q1 is coupled to ground through capacitor C2. Capacitor C2, as discussed below, is at RF frequencies the equivalent of a short circuit. Therefore at RF frequencies, the sources of Q1 and Q2 are at ground potential, and thus neither Q1 nor Q2 is a floating FET.

A tuning capacitor C5 is placed across the terminals of the primary winding of TX1. Capacitors C3 and C4 tune the secondary winding. Capacitors C3 and C4 may optionally be replaced by a single capacitor in shunt across the secondary of TX1, with the risk that the signals on Q1 and Q2 may be less balanced.

The secondary may be optionally center-tapped as shown in FIG. 6. The midpoint of the secondary is coupled to ground through capacitor C6 in order to provide better symmetry in the RF signal at the drains of transistors Q1 and Q2. If the center tap is not used, then capacitor C6 is not necessary.

Capacitor C1 allows for passive self-biasing of the FETs near pinch-off voltage due to rectification of the positive half cycle of LO voltage. As a result, no external biasing is required. Capacitor C1 is charged with the gate side at a negative potential relative to the LO side of the capacitor. Then on the negative half cycle, the lower LO voltage in combination with the charge on C1 keeps each FET from conducting. The LO signal modulates the channel resistance of the FETs from a minimum value when Vgs is approximately zero volts to a maximum value at voltage less than −Vpinch off. The time-varying resistances of the channels of Q1 and Q2 terminate the RF circuit, which includes the transformer TX1 and tuning capacitors C3, C4, and C5. These time-varying resistances, which vary at the rate of the LO frequency, effect the conversion of the RF signal to new signals at frequencies that equal the sums and differences of the LO and RF frequencies and their integer multiples.

The signal corresponding to the difference between the LO and RF frequency is known as the intermediate frequency (IF). The IF signal is conveniently retrieved between transistors Q1 and Q2, instead of at the centertap of the balun. Capacitor C2 acts as a low pass filter to reject higher frequency signals and to allow only the IF to pass through to the IF output.

Figure 7:
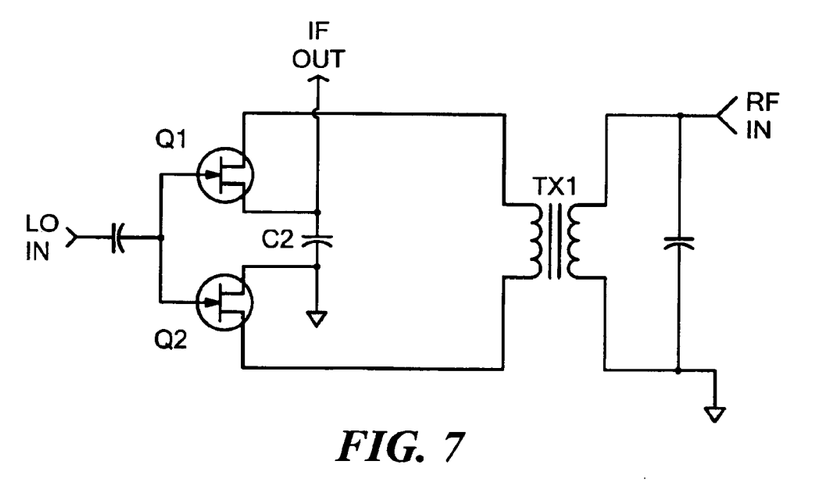
FIG. 7 is a schematic view of a minimum configuration of the passive balun FET mixer in accordance with an embodiment of the present invention.

FIG. 7 shows a minimum configuration of the passive balun FET mixer shown in in FIG. 6, in accordance with an embodiment of the present invention. Optional tuning capacitors C3, C4, and C5 capacitors and coupling capacitor C1 have been removed. The mixer includes two FET transistors, Q1 and Q2. The drains of Q1 and Q2 are connected to the secondary winding of a transformer TX1 acting as a balun. The mixer also includes the IF bypass capacitor C2.

Figure 8:
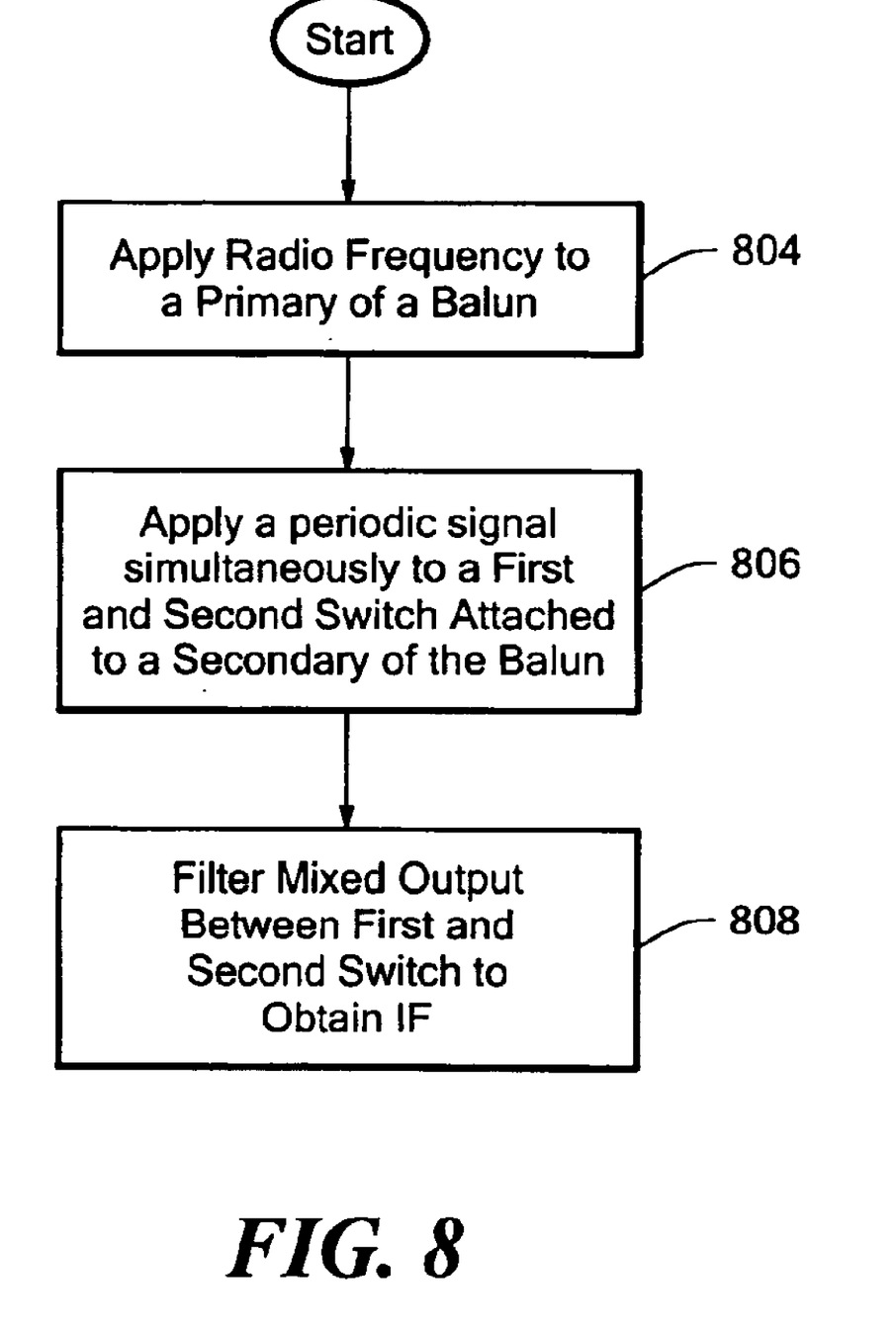
FIG. 8 is a flowchart depicting a method of mixing a periodic signal and a radio frequency signal producing an intermediate frequency.

FIG. 8 shows a method of mixing a periodic signal and a radio frequency signal producing an intermediate frequency. RF is applied to a primary of a balun (step 804), isolating RF from the balun secondary. A periodic signal is applied to a first and second switch, each switch coupled to the other switch, and also attached to a secondary of the balun (step 806). The periodic signal simultaneously turns on and off each transistor periodically, resulting in multiplication of the RF and periodic signals. A mixed signal is thus created, consisting of frequencies equal to the sum and difference of the RF and periodic signal frequencies. A filter is applied to the mixed output between the first and second switch to obtain the intermediate a frequency (step 808). Utilizing a low pass filter, the higher frequency component of the mixed signal is shunted to ground, resulting in down-frequency translation of the RF signal. Alternatively, utilizing a high pass filter will result in up-frequency translation of the RF signal.

In one embodiment of the present invention, the passive balun FET mixer is operable at RF frequencies in the multi-gigahertz range, although this invention will operate in other RF ranges. At these multi-gigahertz frequencies, capacitances are typically in the approximate range of 1–20 pF, with capacitor C2 being of the order of 15 pF, and all other capacitances less than 5 pF. The FETs Q1 and Q2 may be realized as Metal-Semiconductor Field Effect Transistors (MESFETs), which are FETs fabricated of gallium arsenide (GaAs) and formed with a metal-semiconductor junction. The use of MESFETs is not intended to limit the scope of the invention and other types of FETs may be used.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the claims that follow.

What is claimed is:

1. A field effect transistor mixer comprising:
   a) a balun that includes a transformer having a primary winding and a secondary winding, the primary winding coupled to a radio frequency signal input;
   b) a pair of field effect transistors, each transistor having a gate, a source, a drain, and a channel between the source and the drain, wherein
      i) the gates of the transistors are coupled to one another and to a local oscillator input,
      ii) one of the source and the drain of a first of the two transistors is coupled at a node to one of the source and the drain of the other of the two transistors, and the node is coupled to ground,
      iii) the other of the source and the drain of the first of the two transistors is coupled to one side of the secondary winding of the balun and the other of the source and the drain of the second of the two transistors is coupled to the other side of the secondary winding of the balun; and
   c) an intermediate frequency signal output coupled to a point in the circuit path between the first and second transistors,
   wherein, at the node, one of the source and the drain of the second of the two transistors is connected to ground, and the node is coupled to one of the source and drain of the first of the two transistors by a filter.

2. A mixer according to claim 1, the filter having a capacitor serving as a shunt at the frequency of the radio frequency signal but not at the frequency of the intermediate frequency signal.

3. A mixer according to claim 1, wherein the local oscillator input is coupled to the gates via a capacitor so as to cause the transistors to be biased near pinch off.

4. A mixer according to claim 1, further comprising a capacitance disposed across the balun secondary winding to tune the secondary winding.

5. A mixer according to claim 4, wherein the capacitance includes a pair of capacitors connected in series, wherein the node at a connection between the capacitors is coupled to ground.

6. A mixer according to claim 1, wherein the secondary winding has a center tap, and the center tap is coupled to ground.

7. A field effect transistor mixer comprising:
   a) a transformer having a primary winding and a secondary winding, the primary winding coupled to a radio frequency signal;
   b) a pair of switches, comprising of a first switch and a second switch, wherein
      i) the gates of the switches are coupled to one another and to a periodic signal input,
      ii) the first switch is coupled at a node to ground, and the node is coupled to the second switch,
      iii) one switch is attached to one side of the secondary winding of the transformer, and the other switch is attached to the other side of the secondary winding of the transformer; and
   c) an intermediate frequency signal output coupled to a point in the circuit path between the first and second switches,
   wherein, at the node, one of the switches is connected to ground, and the node is coupled to the other switch by a filter.

8. A mixer according to claim 7, the filter having a capacitor serving as a shunt at the frequency of the radio frequency signal but not at the frequency of the intermediate frequency signal.

9. A mixer according to claim 7, wherein the secondary winding of the transformer has a center tap, and the center tap is coupled to ground.

10. A mixer according to claim 7, further comprising tuning circuitry disposed across the primary winding of the transformer.

11. A mixer according to claim 7, further comprising tuning circuitry disposed across the transformer's secondary winding.

12. A method of mixing a periodic signal and a radio frequency signal producing an intermediate frequency signal, the method comprising:

applying the radio frequency signal to a primary winding of a transformer of a balun;

applying a periodic signal simultaneously to a first and a second switch, each switch coupled to the other switch and also coupled to a secondary winding of the transformer of the balun, resulting in a frequency translation of the periodic signal and the radio frequency signal producing a mixed output; and outputting the intermediate frequency signal by filtering the mixed output between the first and second switch.

13. A method according to claim 12, wherein the step of outputting the intermediate signal by filtering the output between the first and second switch includes coupling one switch at a node to ground, and coupling the other switch to the node by a filter.

14. A method according to claim 12, wherein the step of filtering of the mixed output includes applying a capacitance that serves as a shunt at the frequency of the radio frequency signal but not at the frequency of the intermediate signal.

15. A method according to claim 12, further comprising applying a capacitance across the balun secondary winding to tune the secondary winding.

16. A method according to claim 15, wherein the capacitance includes a pair of capacitors in series, wherein the node at a connection between the capacitors is coupled to ground.

17. A method according to claim 12, further comprising applying a capacitance across the balun primary winding to tune the primary winding.

18. A method according to claim 12, further comprising coupling ground to a center tap of the balun secondary winding.

* * * * *